US012532706B2

(12) United States Patent
Takasaki et al.

(10) Patent No.: US 12,532,706 B2
(45) Date of Patent: Jan. 20, 2026

(54) PLASMA PROCESSING APPARATUS AND PLASMA PROCESSING METHOD

(71) Applicant: Panasonic Intellectual Property Management Co., Ltd., Kadoma (JP)

(72) Inventors: Toshiyuki Takasaki, Osaka (JP); Shogo Okita, Hyogo (JP); Minghui Zhao, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 3 days.

(21) Appl. No.: 18/432,232

(22) Filed: Feb. 5, 2024

(65) Prior Publication Data

US 2024/0266201 A1 Aug. 8, 2024

(51) Int. Cl.
*H01L 21/683* (2006.01)
*H01J 37/32* (2006.01)

(52) U.S. Cl.
CPC .... *H01L 21/6833* (2013.01); *H01J 37/32715* (2013.01); *H01J 37/3299* (2013.01); *H01J 2237/24564* (2013.01); *H01J 2237/24585* (2013.01); *H01J 2237/332* (2013.01); *H01J 2237/334* (2013.01)

(58) Field of Classification Search
None
See application file for complete search history.

(56) References Cited

U.S. PATENT DOCUMENTS 8,237,367 B2 * 8/2012 Nonomura ........ H01J 37/32935 315/111.21
11,412,606 B2 * 8/2022 Takikawa .......... H01J 37/32559
11,873,560 B2 * 1/2024 Hirose .................. C23C 16/515
12,087,562 B2 * 9/2024 Hikawa ................. C23C 16/505

FOREIGN PATENT DOCUMENTS

JP 2018-078168 A 5/2018

* cited by examiner

*Primary Examiner* — Kenneth B Wells
(74) *Attorney, Agent, or Firm* — MCDONALD HOPKINS LLC

(57) ABSTRACT

A plasma processing apparatus includes an ESC system having an ESC electrode, a plasma generator generating first and second plasma, a controller controlling the ESC system and the plasma generator such that a first or second processing with the first or second processing is performed on a substrate chucked to a stage, and an abnormality detector detecting abnormality, based on a plurality of parameters. The abnormality detector performs an abnormality detection during predetermined period DT immediately after switching between the first processing and the second processing, based on a first parameter including a monitoring information related to voltage V and/or current I applied to the ESC electrode and does not include a monitoring information related to pressure PR within a chamber, and performs an abnormality detection during a predetermined period outside predetermined period DT, based on a second parameter including the monitoring information related to pressure PR within the chamber.

10 Claims, 4 Drawing Sheets

PLASMA PROCESSING APPARATUS AND PLASMA PROCESSING METHOD

CROSS REFERENCE TO RELATED APPLICATION

The present application is based on and claims priority under 35 U.S.C. § 119 with respect to the Japanese Patent Application No. 2023-017865 filed on Feb. 8, 2023, of which entire content is incorporated herein by reference into the present application.

TECHNICAL FIELD

The present disclosure relates to a plasma processing apparatus and a plasma processing method.

BACKGROUND

Conventionally, a plasma processing apparatus for plasma processing a substrate has been known as disclosed in, for example, Patent Literature 1 (JP2018-78168A). The plasma processing apparatus of Patent Literature 1 includes a chamber, a stage on which a substrate is placed, an electrostatic chuck system having an electrostatic chuck electrode for chucking the substrate to the stage, a plasma generation unit that generates a first plasma and a second plasma in the chamber, and a control unit for controlling the electrostatic chuck system and the plasma generation unit. The control unit controls the plasma generation unit so as to switch between a processing with the first plasma and a processing with the second plasma.

A plasma processing apparatus is configured to detect an abnormality, such as abnormal discharge, in order to avoid damage to the apparatus itself and the substrate. This abnormality detection is performed based on various monitoring parameters measured by a sensor or the like included in the plasma processing apparatus, but in some cases, a period is provided during which the abnormality detection is not performed (hereinafter sometimes referred to as an ignore time) immediately after switching between the processing with the first plasma and the processing with the second plasma. Therefore, if an abnormality occurs during the ignore time, the abnormality is not detected properly, and the processing may be continued incessantly, causing a damage to the apparatus and the substrate. Under such circumstances, one objective of the present disclosure is to improve the accuracy of abnormality detection.

SUMMARY

One aspect of the present disclosure relates to a plasma processing apparatus. The plasma processing apparatus includes: a chamber in which a plasma processing is performed; a stage which is disposed in the chamber and on which a substrate held by a conveying carrier having an annular frame and a holding sheet is placed; an electrostatic chuck system disposed inside the stage and having an electrostatic chuck electrode that, when applied with a voltage, chucks the substrate to the stage; a plasma generation unit that, when applied with a high-frequency power, generates a first plasma and a second plasma in the chamber; a control unit that controls the electrostatic chuck system and the plasma generation unit such that a processing with the first plasma and a processing with the second plasma are performed on the substrate while the substrate is chucked to the stage; and an abnormality detection unit that detects an abnormality, based on a plurality of parameters indicating an operating status of the electrostatic chuck system and the plasma generation unit, wherein the abnormality detection unit performs an abnormality detection during a predetermined period immediately after switching between the processing with the first plasma and the processing with the second plasma, based on a first parameter that includes a monitoring information related to at least one of a voltage and a current applied to the electrostatic chuck electrode and does not include a monitoring information related to a pressure within the chamber, and performs an abnormality detection during other than the predetermined period, based on a second parameter that includes the monitoring information related to the pressure within the chamber.

Another aspect of the present disclosure relates to a plasma processing method. The plasma processing method uses a plasma processing apparatus including a chamber in which a plasma processing is performed, a stage which is disposed in the chamber and on which a substrate held by a conveying carrier having an annular frame and a holding sheet is placed, an electrostatic chuck system disposed inside the stage and having an electrostatic chuck electrode that, when applied with a voltage, chucks the substrate to the stage, and a plasma generation unit that, when applied with a high-frequency power, generates a first plasma and a second plasma in the chamber, the method including: a control step of controlling the electrostatic chuck system and the plasma generation unit such that a processing with the first plasma and a processing with the second plasma are performed on the substrate while the substrate is chucked to the stage; and an abnormality detection step of detecting an abnormality, based on a plurality of parameters indicating an operating status of the electrostatic chuck system and the plasma generation unit, wherein in the abnormality detection step, an abnormality detection during a predetermined period immediately after switching between the processing with the first plasma and the processing with the second plasma is performed, based on a first parameter that includes a monitoring information related to at least one of a voltage and a current applied to the electrostatic chuck electrode and does not include a monitoring information related to a pressure within the chamber, and an abnormality detection during other than the predetermined period is performed, based on a second parameter that includes the monitoring information related to the pressure within the chamber.

According to the present disclosure, it is possible to improve the accuracy of abnormality detection.

DETAILED DESCRIPTION

Figure 1:
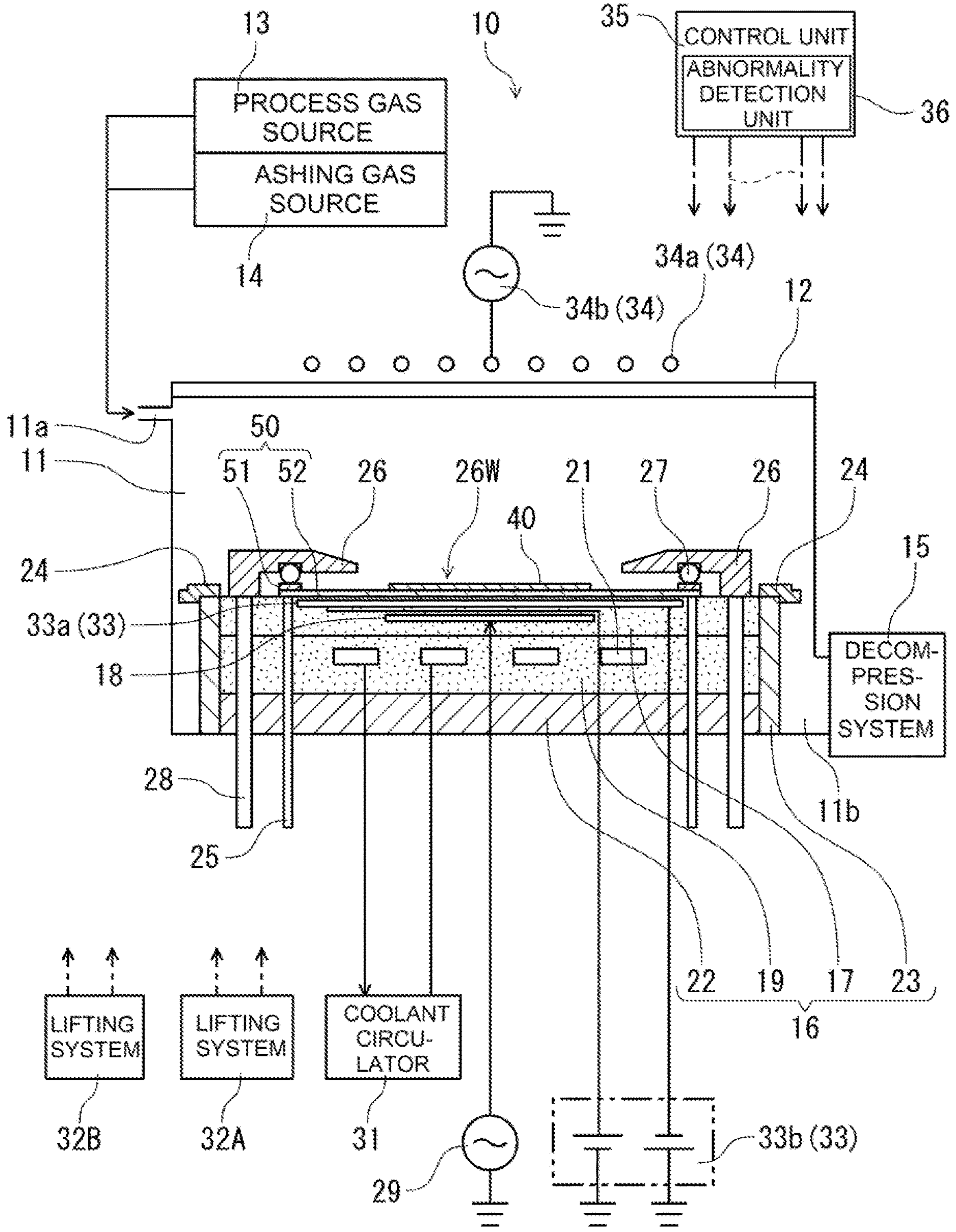
FIG. 1 is a schematic cross-sectional view of one example of a plasma processing apparatus according to the present disclosure.

Embodiments of a plasma processing apparatus and a plasma processing method according to the present disclosure will be described below by way of examples. It is to be noted, however, that the present disclosure is not limited to the examples described below. In the description below, specific numerical values and materials are exemplified in some cases, but other numerical values and materials may be applied as long as the effects of the present disclosure can be achieved.

Plasma Processing Apparatus

The plasma processing apparatus according to the present disclosure may be, for example, a plasma etching apparatus or a plasma dicer. The plasma processing apparatus according to the present disclosure includes a chamber, a stage, an electrostatic chuck system, a plasma generation unit, a control unit, and an abnormality detection unit.

The chamber is a place where the substrate is plasma processed. Plasma processing is a processing, with a substrate exposed to a plasma, performed on the substrate by utilizing chemical and physical actions of the plasma. Generating a high-frequency power in a plasma generation unit while supplying a process gas into the chamber under reduced pressure can generate a plasma, and the substrate can be plasma processed.

The stage is disposed in the chamber. On the stage, a substrate held by a conveying carrier having an annular frame and a holding sheet is placed. The stage may have a horizontal placement surface on which the substrate is placed. The stage may have a flow channel through which a coolant flows for cooling the substrate and the conveying carrier during plasma processing. The stage may have a lower electrode to which a high-frequency power is applied. The substrate may be, for example, a semiconductor substrate to be singulated by plasma etching. The semiconductor substrate includes a plurality of element regions and dicing regions defining the element regions. The element region includes, for example, a semiconductor layer and a wiring layer. An element chip having a semiconductor layer and a wiring layer can be obtained by etching along the dicing regions.

The electrostatic chuck system has an electrostatic chuck electrode (hereinafter sometimes referred to as an ESC electrode). The ESC electrode is placed inside the stage, and when applied with a voltage, chucks the substrate to the stage. The electrostatic chuck system may further include a power source unit for applying a voltage to the ESC electrode.

The plasma generation unit, when applied with a high-frequency power, generates a first plasma and a second plasma in the chamber. The first plasma may be a plasma for depositing a protective film on a surface of the substrate. The second plasma may be a plasma for etching the surface of the substrate. The process gas corresponding to the first plasma and the process gas corresponding to the second plasma may be different from each other. Examples of the former process gas include a gas containing $C_4F_8$. Examples of the latter process gas include a gas containing $SF_6$. The plasma generation unit may include at least one coil that, when applied with a high-frequency power, generates an alternating magnetic field.

The control unit controls the electrostatic chuck system and the plasma generation unit such that a processing with the first plasma and a processing with the second plasma are performed on the substrate while the substrate is chucked to the stage. For example, the control unit may control the plasma generation unit to generate a high-frequency power while a voltage is applied to the ESC electrode. The control unit may include an arithmetic device, and a memory device storing a program executable by the arithmetic device.

The abnormality detection unit detects an abnormality (e.g., abnormal discharge during plasma processing), based on a plurality of parameters indicating an operating status of the electrostatic chuck system and the plasma generation unit. The abnormality detection unit may be integrated with or separate from the control unit. The plurality of parameters include, for example, monitoring information related to a voltage and a current applied to the ESC electrode, a pressure within the chamber, a high-frequency power applied to the plasma generation unit, a capacitance value of a variable capacitor that adjusts the plasma impedance, and the like. The plurality of parameters can be measured with a sensor or the like included in the plasma processing apparatus. Examples of the sensor included in the plasma processing apparatus include a voltmeter, an ammeter, a pressure meter, and a wattmeter.

The abnormality detection unit performs an abnormality detection during a predetermined period (ignore time) immediately after switching between a processing with the first plasma and a processing with the second plasma, based on a first parameter, and performs an abnormality detection during other than the predetermined period, based on a second parameter. The first parameter includes a monitoring information related to at least one of a voltage and a current applied to the ESC electrode and does not include a monitoring information related to a pressure within the chamber. The second parameter includes the monitoring information related to the pressure within the chamber. The abnormality detection during the predetermined period and the abnormality detection during other than the predetermined period may be performed by a method that determines an abnormality as having occurred when each parameter fluctuates beyond a predetermined threshold value. The predetermined threshold value may be, for example, a fluctuation rate relative to the set value of each parameter, or may be any predetermined absolute value. The monitoring information related to at least one of the voltage and the current applied to the ESC electrode includes, for example, a measured value of the voltage applied to the ESC electrode, and a measured value of the current flowing in the ESC electrode. The monitoring information related to the pressure within the chamber includes, for example, a measured value of the pressure within the chamber.

The present inventors, as a result of intensive studies, found that a plurality of parameters that can be used for abnormality detection include parameters suitable for an abnormality detection during the ignore time and those not suitable. According to the finding, the parameters suitable for the abnormality detection during the ignore time include a monitoring information related to a voltage and a current applied to the ESC electrode, while the parameters not suitable for the abnormality detection during the ignore time include a monitoring information related to a pressure within the chamber. This is because during the ignore time, the former is unlikely to fluctuate significantly unless an abnormality occurs, while the latter tends to fluctuate significantly even if no abnormality occurs (even during normal operation). The pressure in the chamber is a physical quantity that reflects the degree of decomposition of the source gas by plasma, and therefore, when the degree of decomposition of the source gas changes due to abnormal discharge, the pressure in the chamber tends to change as well. For the reason as above, it is desirable to use the monitoring information related to the pressure within the chamber for the abnormality detection during other than the ignore time.

Utilizing such knowledge, the abnormality detection unit of the present disclosure is configured to perform abnormality detection based on the above-mentioned first parameter during the ignore time, while performing abnormality detection based on the above-mentioned second parameter during other than the ignore time. This makes it possible to appropriately detect an abnormality without causing false detection, during the ignore time.

The first parameter may not include a monitoring information related to a high-frequency power applied to the plasma generation unit. Examples of the monitoring information related to the high-frequency power applied to the plasma generation unit include a measured value of a traveling-wave power applied to the plasma generation unit from a high-frequency power source, and a measured value of a reflected-wave power from the plasma generation unit. The inventors of the present application have found that, in addition to the monitoring information related to the pressure within the chamber, the monitoring information related to the high-frequency power applied to the plasma generation unit is also not suitable in some cases for the abnormality detection during the neglect time. Therefore, by not including the monitoring information related to the high-frequency power in the first parameter, the accuracy of abnormality detection can be further improved.

The second parameter may further include the monitoring information related to at least one of the voltage and the current applied to the ESC electrode. This can further improve the accuracy of abnormality detection during other than the ignore time.

The control unit may be configured not to change the set value of the voltage applied to the electrostatic chuck electrode when switching between the processing with the first plasma and the processing with the second plasma. If the set value of the voltage applied to the ESC electrode is changed at the time of the above switching, along with the change, the monitoring information related to the voltage and the current applied to the ESC electrode may fluctuate significantly even though no abnormality has occurred. In that case, depending on the magnitude relationship between the amount of fluctuation and the threshold value, there is a risk of falsely detecting an abnormality. In contrast, by not changing the set value of the voltage applied to the ESC electrode, it is possible to avoid the false abnormality detection caused by such a mechanism. In the present specification, “not changing the set value” means not only “not changing the set value strictly”, but also “slightly changing the set value” (e.g., ±2% of the set value).

The first plasma may deposit a protective film on a surface of the substrate. The second plasma may etch the surface of the substrate. The control unit may control the plasma generation unit so as to alternately perform the processing with the first plasma and the processing with the second plasma. According to such control, a so-called Bosch process can be performed. In the Bosch process, since the processing with the first plasma and the processing with the second plasma are switched in a relatively short cycle (e.g., a cycle of several seconds), the dead time occupies a large proportion of the processing time, and the effect by the abnormality detection unit of the present disclosure can be particularly effectively utilized.

Plasma Processing Method

The plasma processing method according to the present disclosure may be performed using, for example, the above-described plasma processing apparatus. The plasma processing method according to the present disclosure includes a control step and an abnormality detection step.

In the control step, the electrostatic chuck system and the plasma generation unit are controlled such that a processing with the first plasma and a processing with the second plasma are performed on the substrate while the substrate is chucked to the stage. For example, in the control process, a high-frequency power may be generated in the plasma generation unit while a voltage is applied to the ESC electrode.

In the abnormality detection step, an abnormality (e.g., abnormal discharge during plasma processing) is detected, based on a plurality of parameters indicating an operating status of the electrostatic chuck system and the plasma generation unit. The plurality of parameters include, for example, monitoring information related to a voltage and a current applied to the ESC electrodes, a pressure within the chamber, a high-frequency power applied to the plasma generation unit, and a capacitance value of a variable capacitor that adjusts the plasma impedance. The plurality of parameters can be measured with a sensor or the like included in the plasma processing apparatus. Examples of the sensor included in the plasma processing apparatus include a voltmeter, an ammeter, a pressure meter, and a wattmeter.

In the abnormality detection step, an abnormality detection during a predetermined period (ignore time) immediately after switching between the processing with the first plasma and the processing with the second plasma is performed, based on an first parameter, and an abnormality detection during other than the predetermined period is performed, based on a second parameter. The first parameter includes a monitoring information related to at least one of a voltage and a current applied to the ESC electrode and does not include a monitoring information related to a pressure within the chamber. The second parameter includes the monitoring information related to the pressure within the chamber.

In the abnormality detection step of the present disclosure, with the aforementioned finding utilized, during the ignore time, an abnormality detection is performed, based on the first parameter that includes the monitoring information related to at least one of the voltage and the current applied to the ESC electrode and does not include the monitoring information related to the pressure within the chamber, and during other than the ignore time, an abnormality detection is performed, based on the second parameter that includes the monitoring information related to the pressure within the chamber. This makes it possible to appropriately detect an abnormality without causing false detection during the ignore time.

The first parameter may not include a monitoring information related to a high-frequency power applied to the plasma generation unit. Examples of the monitoring information related to the high-frequency power applied to the plasma generation unit include a measured value of a traveling-wave power applied to the plasma generation unit from a high-frequency power source, and a measured value of a reflected-wave power from the plasma generation unit. By not including the monitoring information related to the high-frequency power in the first parameter, the accuracy of abnormality detection can be further improved.

The second parameter may further include the monitoring information related to at least one of the voltage and the current applied to the ESC electrode. This can further improve the accuracy of abnormality detection during other than the ignore time.

In the control step, when switching between the processing with the first plasma and the processing with the second plasma, the set value of the voltage applied to the electrostatic chuck electrode may not be changed. By not changing the set value of the voltage applied to the ESC electrode, it is possible to avoid a false detection of abnormality due to fluctuations in the voltage and the current applied to the ESC electrode that may occur when the set value is changed.

The first plasma may deposit a protective film on a surface of the substrate. The second plasma may etch the surface of the substrate. In the control step, the plasma generation unit may be controlled so as to alternately perform the processing with the first plasma and the processing with the second plasma. In the Bosch process performed through such a control, since the processing with the first plasma and the processing with the second plasma are switched in a relatively short cycle (e.g., a cycle of several seconds), the ignore time occupies a large proportion of the processing time, and the effect by the abnormality detection unit of the present disclosure can be particularly effectively utilized.

As described above, according to the present disclosure, the accuracy of abnormality detection can be increased by suppressing the false detection of abnormality during the ignore time.

In the following, examples of the plasma processing apparatus and the plasma processing method according to the present disclosure will be specifically described with reference to the drawings. The components and steps as described above may be applied to the components and steps of the examples of the plasma processing apparatus and the plasma processing method as described below. The components and steps of the examples of the plasma processing apparatus and the plasma processing method as described below can be changed based on the description above. The matters described below may be applied to the aforementioned embodiments. Of the components and steps of the examples of the plasma processing apparatus and the plasma processing method as described below, those not essential for the plasma processing apparatus and the plasma processing method according to the present disclosure may be omitted. It is to be noted that the figures shown below are schematic ones, and do not accurately reflect the shape and the number of the actual members.

Plasma Processing Apparatus

A plasma processing apparatus 10 of the present embodiment is a plasma dicer, but is not limited thereto. As illustrated in FIG. 1, the plasma processing apparatus 10 includes a chamber 11, a stage 16, a cover 26, an electrostatic chuck system 33, a plasma generation unit 34, a control unit 35, and an abnormality detection unit 36.

The chamber 11 is approximately cylindrical in shape, with the top open. The open top is closed by a dielectric member 12 serving as a lid. Examples of the constituent material of the chamber 11 include aluminum, stainless steel (SUS), and aluminum with anodic oxide coating. Examples of the constituent material of the dielectric member 12 include yttrium oxide ($Y_2O_3$), aluminum nitride (AlN), alumina ($Al_2O_3$), quartz ($SiO_2$), and other dielectric materials.

The chamber 11 is connected with a gas inlet 11*a*. To the gas inlet 11*a*, a process gas source 13 and an ashing gas source 14, which are sources of plasma generation gases (process gases), are each connected through piping. Also, the chamber 11 is provided with an exhaust port 11*b*. To the exhaust port 11*b*, a decompression system 15 including a vacuum pump for exhausting gas from the chamber 11 to reduce the pressure therein is connected.

The stage 16 is disposed on the bottom side within the chamber 11. On the stage 16, a substrate 40 held by a conveying carrier 50 having an annular frame 51 and a holding sheet 52 is placed. The conveying carrier 50 is placed on the stage 16, with a surface holding the substrate 40 of the holding sheet 52 faced upward. The stage 16 has such a size that the whole conveying carrier 50 can be placed thereon.

The stage 16 includes an electrode layer 17, a metal layer 19, and a base table 22 supporting the electrode layer 17 and the metal layer 19, each being approximately circular. The stage 16 further includes an outer peripheral portion 23 surrounding the electrode layer 17, the metal layer 19, and the base table 22. The outer peripheral portion 23 is formed of a metal having electrical conductivity and etching resistance, and serves to protect the electrode layer 17, the metal layer 19, and the base table 22 from plasma. On the top surface of the outer peripheral portion 23, an annular outer peripheral ring 24 is disposed. The outer peripheral ring 24 serves to protect the top surface of the outer peripheral portion 23 from plasma. The electrode layer 17 and the outer peripheral ring 24 are formed of, for example, the aforementioned dielectric material. The electrode layer 17 is provided in its inside with a lower electrode 18 electrically connected to a second high-frequency power source 29.

The metal layer 19 is formed of, for example, aluminum with an anodic oxide coating. In the metal layer 19, a coolant channel 21 is formed. The stage 16 can be cooled by a coolant flowing through the coolant channel 21. By cooling the stage 16, the holding sheet 52 placed on the stage 16 is cooled, and the cover 26 partially in contact with the stage 16 is also cooled. This protects the substrate 40 and the holding sheet 52 from being damaged by being heated during plasma processing. The coolant in the coolant channel 21 is circulated by a coolant circulator 31.

Near the outer periphery of the stage 16, a plurality of support members 25 extending through the stage 16 are disposed. The support members 25 support the frame 51 of the conveying carrier 50. The support members 25 are driven by a lifting system 32A, and move upward and downward. The conveying carrier 50 having delivered into the chamber 11 is passed onto the support members 25 at a predetermined raised position. Then the support members 25 descend until their top surfaces become flush with or lower than the top surface of the stage 16, which sets the conveying carrier 50 at a predetermined position on the stage 16.

The cover 26 is placed above the stage 16 within the chamber 11. The cover 26 has a window 26W for exposing at least part of the substrate 40. The cover 26 is provided with pressing members 27 for pushing the frame 51 downward while the frame 51 is placed on the stage 16. The pressing members 27 are preferably a member that can achieve point contact with the frame 51 (e.g., coil spring, elastic resin). This can correct a distortion of the frame 51, while restricting a thermal communication between the frame 51 and the cover 26.

A plurality of lifting rods 28 are coupled to the cover 26 at its end, so that the cover 26 can be raised and lowered. The lifting rods 28 are driven to move up and down by a lifting system 32B. The lifting and lowering operation of the cover 26 by the lifting system 32B can be controlled independently from the operation of the support members 25 by the lifting system 32.

The electrostatic chuck system 33 includes an electrostatic chuck electrode 33*a* (ESC electrode 33A) disposed inside the electrode layer 17, and a DC power source 33*b* electrically connected to the ESC electrode 33A. The ESC electrode 33A, when applied with a voltage from the DC power source 33*b*, chucks the substrate 40 (or an assembly including the substrate 40 and the conveying carrier 50) to the stage 16.

The plasma generation unit 34 is disposed above the dielectric member 12. The plasma generation unit 34 includes a coil 34*a* serving as an upper electrode, and a first high-frequency power source 34*b* electrically connected to the coil 34*a*. The plasma generation unit 34, when applied with a high-frequency power from the first high-frequency power source 34*b* to the coil 34*a* while a process gas is supplied into the chamber 11 under reduced pressure, generates a first plasma and a second plasma in the chamber 11.

The control unit 35 controls the electrostatic chuck system 33 (specifically, the DC power source 33*b*) and the plasma generation unit 34 (specifically, the first high-frequency power source 34*b*), such that a processing with the first plasma and a processing with the second plasma are performed on the substrate 40 while the substrate 40 is chucked to the stage 16. The control unit 35 is configured not to change the set value of a voltage V applied to the ESC electrode 33A when switching between the processing with the first plasma and the processing with the second plasma. The control unit 35 controls the plasma generation unit 34 so as to alternately perform the processing with the first plasma and the processing with the second plasma a plurality of times. Here, the first plasma deposits a protective film (not shown) on a surface of the substrate 40, while the second plasma etches the surface of the substrate 40.

In addition to the aforementioned control, the control unit 35 controls the operations of the components of the plasma processing apparatus 10, including the second high-frequency power source 29, the process gas source 13, the ashing gas source 14, the decompression system 15, the coolant circulator 31, the lifting system 32A, and the lifting system 32B.

The abnormality detection unit 36 detects an abnormality in the plasma processing apparatus 10, based on a plurality of parameters indicating an operating status of the electrostatic chuck system 33 and the plasma generation unit 34. The abnormality detection unit 36 performs an abnormality detection during a predetermined period DT (ignore time DT) immediately after switching between the processing with the first plasma and the processing with the second plasma, based on a first parameter, and on the other hand, performs an abnormality detection during other than the predetermined period DT, based on a second parameter. The first parameter includes a monitoring information related to both a voltage V and a current I applied to the ESC electrode 33A, and includes neither a monitoring information related to a pressure PR in the chamber 11 nor a monitoring information related to a high-frequency power PW of the plasma generation unit 34. The second parameter includes the monitoring information related to both the voltage V and the current I applied to the ESC electrode 33A, as well as the monitoring information related to the pressure PR within the chamber 11. The abnormality detection unit 36 of the present embodiment is integrated with the control unit 35, but is not limited thereto.

Figure 2:
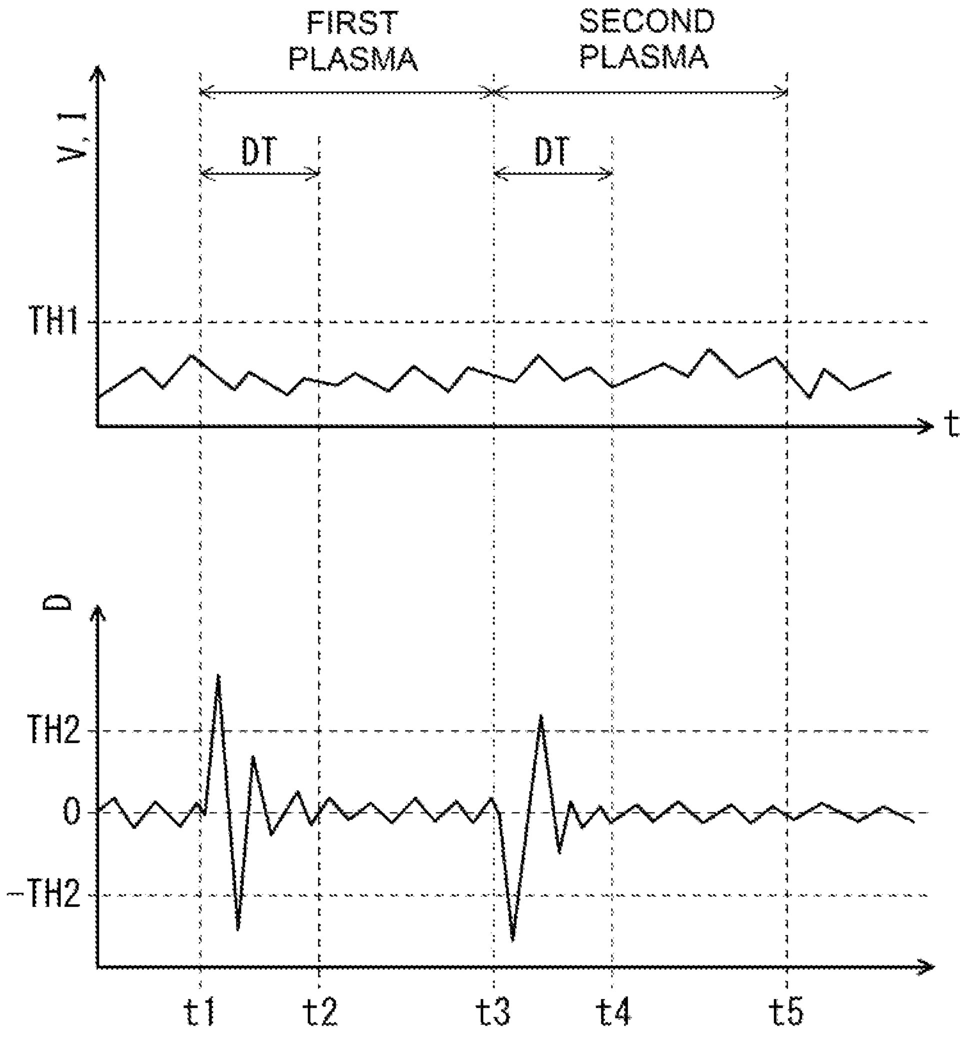
FIG. 2 is a graph showing a relationship between each parameter and time when no abnormality occurs during the ignore time.
Figure 3:
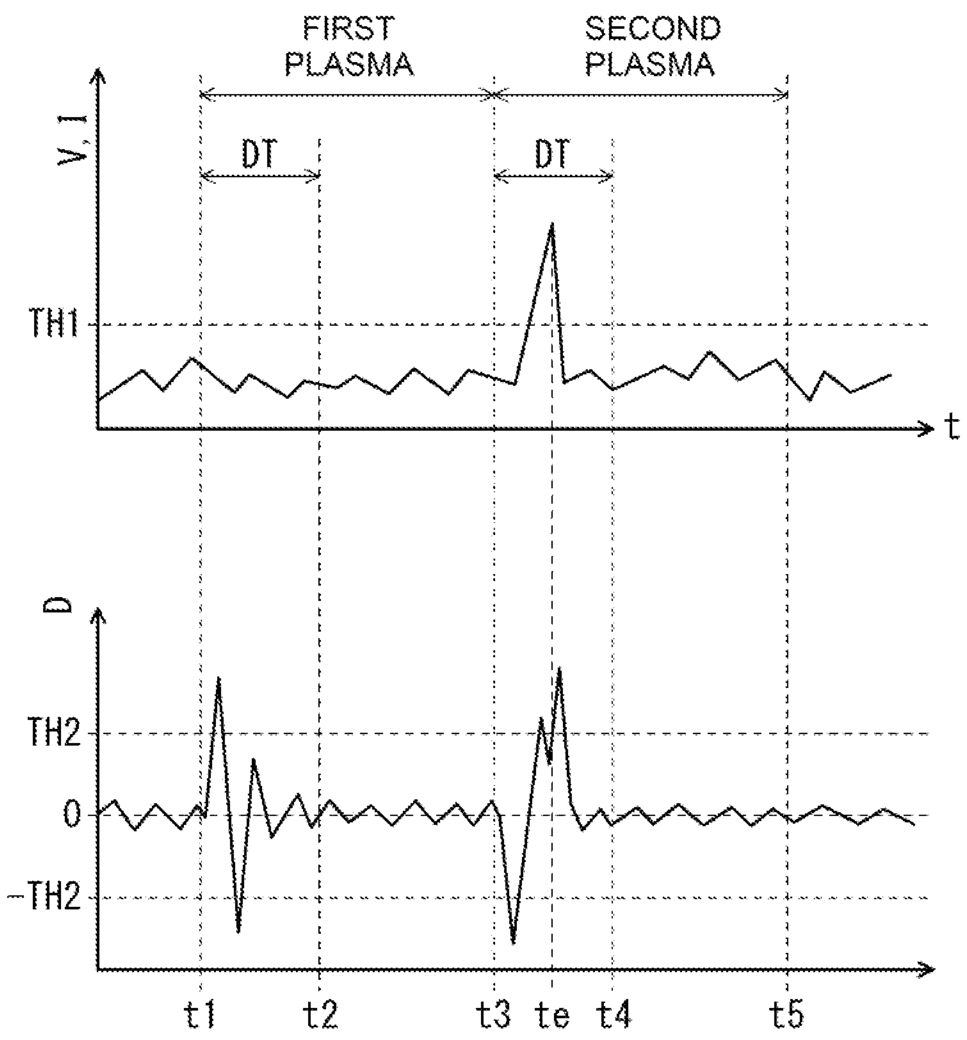
FIG. 3 is a graph showing a relationship between each parameter and time when an abnormality occurs at a time te during the ignore time.

FIG. 2 is a graph showing a relationship between each parameter and time when no abnormality occurs during the ignore time DT immediately after the processing with the first plasma is switched to the processing with the second plasma. FIG. 3 is a graph showing a relationship between each parameter and time when an abnormality occurs at time te during the ignore time DT immediately after the processing with the first plasma is switched to the processing with the second plasma. As shown in FIGS. 2 and 3, in the ignore time DT, if the plasma processing is normally performed, the voltage V and the current I applied to the ESC electrode 33A do not fluctuate beyond a first threshold TH1, but on the other hand, if an abnormality occurs during plasma processing, they fluctuate beyond the first threshold TH1. In contrast thereto, the monitoring information related to the pressure PR in the chamber 11, specifically, a fluctuation rate D from the set value of the pressure PR can fluctuate beyond a second threshold TH2 in the ignore time DT, even if the plasma processing is normally performed. Here, the fluctuation rate D is calculated using a measured value M and a set value S of the pressure PR, as $D=(M-S)/S$. The pressure PR within the chamber 11 in the plasma processing apparatus 10 is usually controlled by adjusting the opening degree of an exhaust valve provided between the chamber 11 and a vacuum pump for exhausting the chamber 11. When switching from the processing with the first plasma to the processing with the second plasma, which are performed under different conditions, such as different pressures, flow rates, and gas compositions, is performed, a time delay occurs between immediately after the switching and before the pressure is stabilized. In view of the characteristics of each parameter, in the ignore time DT, the abnormality detection unit 36 of the present embodiment uses the first parameter suitable for abnormality detection during that period.

The processing time (times t1 to t3) of the processing with the first plasma may be, for example, 0.5 seconds or more and 5 seconds or less. The ignore time DT (times t1 to t2) in the processing with the first plasma may be, for example, 0.5 seconds or more and 2 seconds or less. The processing time (time t3 to t5) of the processing with the second plasma may be, for example, 0.5 seconds or more and 15 seconds or less. The ignore time DT (times t3 to t4) in the processing with the second plasma may be, for example, 0.5 seconds or more and 3 seconds or less.

Plasma Processing Method

Figure 4:
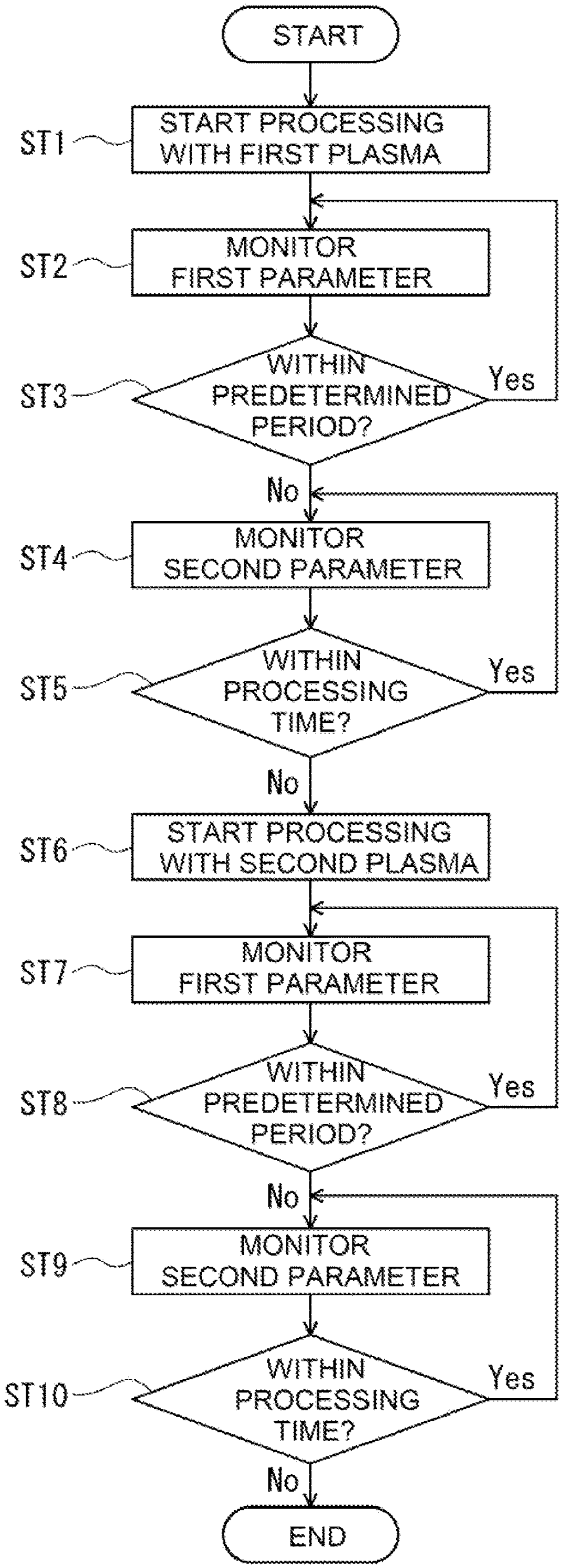
FIG. 4 is a flowchart of an example of a plasma processing method according to the present disclosure.

Next, a plasma processing method executable using the above plasma processing apparatus 10 will be described with reference to FIG. 4. The plasma processing method of the embodiment includes a first step ST1 to a tenth step ST10.

In the first step ST1, a processing with a first plasma (e.g., a protective film deposition processing) is started. Specifically, in the first step ST1, the electrostatic chuck system 33 (specifically, the DC power source 33*b*) and the plasma generation unit (specifically, the first high-frequency power source 34*b*) are controlled, with a process gas corresponding to the first plasma supplied to the chamber 11 under reduced pressure, so that the processing with the first plasma is performed on the substrate 40 while the substrate 40 is chucked to the stage 16. The first step ST1 is an example of the control step. Subsequently, the process proceeds to a second step ST2.

In the second step ST2, an abnormality in the plasma processing apparatus 10 is detected, based on a first parameter. The first parameter includes a monitoring information related to at least one of a voltage V and a current I applied to the ESC electrode 33A, and includes neither a monitoring information related to a pressure PR within the chamber 11 nor a monitoring information related to a high-frequency power PW of the plasma generation unit 34. For example, in the second step ST2, it may be determined that an abnormality has occurred in the plasma processing apparatus 10 when the voltage V or the current I applied to the ESC electrode 33A fluctuates beyond a first threshold value TH1. The second step ST2 is an example of the abnormality detection step. Subsequently, the process proceeds to a third step ST3.

In the third step ST3, after the processing with the first plasma is started, it is determined whether or not it is within a predetermined period DT. If it is within the predetermined period DT (if Yes), the process returns to the second step ST2. On the other hand, if it is not within the predetermined period DT (if No), the process proceeds to a fourth step ST4.

In the fourth step ST4, an abnormality in the plasma processing apparatus 10 is detected, based on a second parameter. The second parameter includes the monitoring information related to at least one of the voltage V and the current I applied to the ESC electrode 33A, and the monitoring information related to the pressure PR within the chamber 11. For example, in the fourth step ST4, it may be determined that an abnormality has occurred in the plasma processing apparatus 10 when the monitoring information related to the pressure PR in the chamber 11 fluctuates beyond a second threshold value TH2. An example of the monitoring information related to the pressure PR within the chamber 11 is a fluctuation rate D of the pressure PR from the set value. The fluctuation rate D is calculated using a measured value M and a set value S of the pressure PR, as D=(M−S)/S. The fourth step ST4 is an example of the abnormality detection step. Subsequently, the process proceeds to a fifth step ST5.

In the fifth step ST5, it is determined whether or not it is within a processing time of the processing with the first plasma. If it is within the processing time (if Yes), the process returns to the fourth step ST4. On the other hand, if it is not within the processing time (if No), the process proceeds to a sixth step ST6.

In the sixth step ST6, a processing with a second plasma (e.g., etching processing) is started. Specifically, in the sixth step ST6, the electrostatic chuck system 33 (specifically, the DC power source 33*b*) and the plasma generation unit (specifically, the first high-frequency power source 34*b*) are controlled, with a process gas corresponding to the second plasma supplied into the chamber 11 under reduced pressure, so that the substrate 40 is processed with the second plasma while the substrate 40 is chucked to the stage 16. The sixth step ST6 is an example of the control step. Subsequently, the process proceeds to a seventh step ST7.

In the seventh step ST7, an abnormality in the plasma processing apparatus 10 is detected, based on the first parameter. For example, in the seventh step ST7, it may be determined that an abnormality has occurred in the plasma processing apparatus 10 when the voltage V or the current I applied to the ESC electrode 33A fluctuates beyond the first threshold value TH1. The seventh step ST7 is an example of the abnormality detection step. Subsequently, the process proceeds to an eighth step ST8.

In the eighth step ST8, after the processing with the second plasma is started, it is determined whether or not it is within a predetermined period DT. If it is within the predetermined period DT (if Yes), the process returns to the seventh step ST7. On the other hand, if it is not within the predetermined period DT (if No), the process proceeds to a ninth step ST9.

In the ninth step ST9, an abnormality in the plasma processing apparatus 10 is detected, based on the second parameter. For example, in the ninth step ST9, it may be determined that an abnormality has occurred in the plasma processing apparatus 10 when the monitoring information related to the pressure PR within the chamber 11 fluctuates beyond the second threshold value TH2. An example of the monitoring information related to the pressure PR within the chamber 11 is a fluctuation rate D of the pressure PR from the set value. The fluctuation rate D is calculated using a measured value M and a set value S of the pressure PR, as D=(M−S)/S. The ninth step ST9 is an example of the abnormality detection step. Subsequently, the process proceeds to a tenth step ST10.

In the tenth step ST10, it is determined whether or not it is within the processing time of the processing with the second plasma. If it is within the processing time (if Yes), the process returns to the ninth step ST9. On the other hand, if it is not within the processing time (if No), the series of processing ends (or returns to the first step ST1). By repeatedly performing the first step ST1 to tenth step ST10, the processing with the first plasma and the processing with the second plasma can be alternately performed a plurality of times. The set value of the voltage V applied to the ESC electrode 33A may be constant throughout the first step ST1 to the tenth step ST10.

SUPPLEMENTARY NOTE

The following techniques are disclosed by the foregoing description of embodiments.

Technique 1

A plasma processing apparatus, comprising:

a chamber in which a plasma processing is performed;

a stage which is disposed in the chamber and on which a substrate held by a conveying carrier having an annular frame and a holding sheet is placed;

an electrostatic chuck system disposed inside the stage and having an electrostatic chuck electrode that, when applied with a voltage, chucks the substrate to the stage;

a plasma generation unit that, when applied with a high-frequency power, generates a first plasma and a second plasma in the chamber;

a control unit that controls the electrostatic chuck system and the plasma generation unit such that a processing with the first plasma and a processing with the second plasma are performed on the substrate while the substrate is chucked to the stage; and an abnormality detection unit that detects an abnormality, based on a plurality of parameters indicating an operating status of the electrostatic chuck system and the plasma generation unit, wherein the abnormality detection unit performs an abnormality detection during a predetermined period immediately after switching between the processing with the first plasma and the processing with the second plasma, based on a first parameter that includes a monitoring information related to at least one of a voltage and a current applied to the electrostatic chuck electrode and does not include a monitoring information related to a pressure within the chamber, and performs an abnormality detection during other than the predetermined period, based on a second parameter that includes the monitoring information related to the pressure within the chamber.

Technique 2

The plasma processing apparatus according to technique 1, wherein the first parameter does not include a monitoring information related to a high-frequency power applied to the plasma generation unit.

Technique 3

The plasma processing apparatus according to technique 1 or 2, wherein the second parameter further includes the monitoring information related to at least one of the voltage and the current applied to the electrostatic chuck electrode.

Technique 4

The plasma processing apparatus according to any one of techniques 1 to 3, wherein the control unit is configured not to change a set value of the voltage applied to the electrostatic chuck electrode, when switching between the processing with the first plasma and the processing with the second plasma.

Technique 5

The plasma processing apparatus according to any one of techniques 1 to 4, wherein the first plasma deposits a protective film on a surface of the substrate, the second plasma etches the surface of the substrate, and the control unit controls the plasma generation unit so as to alternately perform the processing with the first plasma and the processing with the second plasma.

Technique 6

A plasma processing method using a plasma processing apparatus including a chamber in which a plasma processing is performed, a stage which is disposed in the chamber and on which a substrate held by a conveying carrier having an annular frame and a holding sheet is placed, an electrostatic chuck system disposed inside the stage and having an electrostatic chuck electrode that, when applied with a voltage, chucks the substrate to the stage, and a plasma generation unit that, when applied with a high-frequency power, generates a first plasma and a second plasma in the chamber, the method comprising:

a control step of controlling the electrostatic chuck system and the plasma generation unit such that a processing with the first plasma and a processing with the second plasma are performed on the substrate while the substrate is chucked to the stage; and an abnormality detection step of detecting an abnormality, based on a plurality of parameters indicating an operating status of the electrostatic chuck system and the plasma generation unit, wherein in the abnormality detection step, an abnormality detection during a predetermined period immediately after switching between the processing with the first plasma and the processing with the second plasma is performed, based on a first parameter that includes a monitoring information related to at least one of a voltage and a current applied to the electrostatic chuck electrode and does not include a monitoring information related to a pressure within the chamber, and an abnormality detection during other than the predetermined period is performed, based on a second parameter that includes the monitoring information related to the pressure within the chamber.

Technique 7

The plasma processing method according to technique 6, wherein the first parameter does not include a monitoring information related to a high-frequency power applied to the plasma generation unit.

Technique 8

The plasma processing method according to technique 6 or 7, wherein the second parameter further includes the monitoring information related to at least one of the voltage and the current applied to the electrostatic chuck electrode.

Technique 9

The plasma processing method according to any one of techniques 6 to 8, wherein in the control step, a set value of the voltage applied to the electrostatic chuck electrode is not changed, when switching between the processing with the first plasma and the processing with the second plasma.

Technique 10

The plasma processing method according to any one of techniques 6 to 9, wherein the first plasma deposits a protective film on a surface of the substrate, the second plasma etches the surface of the substrate, and in the control step, the plasma generation unit is controlled so as to alternately perform the processing with the first plasma and the processing with the second plasma.

The present disclosure can be utilized for a plasma processing apparatus and a plasma processing method.

REFERENCE NUMERALS

10: plasma processing apparatus
11: chamber
11*a*: gas inlet
11*b*: exhaust port
12: dielectric member
13: process gas source
14: ashing gas source
15: decompression system
16: stage
17: electrode layer
18: lower electrode
19: metal layer
21: coolant channel
22: base table
23: outer peripheral portion
24: outer peripheral ring
25: support member
26: cover
26W: window
27: pressing member
28: lifting rod
29: second high-frequency power source
31: coolant circulator 32A: lifting system
32B: lifting system
33: electrostatic chuck system
33*a*: electrostatic chuck electrode (ESC electrode)
33*b*: DC power source
34: plasma generation unit
34*a*: coil
34*b*: first high-frequency power source
35: control unit
36: abnormality detection unit
40: substrate
50: conveying carrier
51: frame
52: holding sheet
D: fluctuation rate
DT: predetermined period (ignore time)
I: current applied to ESC electrode
PR: pressure within chamber
PW: high-frequency power of plasma generation unit
TH1: first threshold
TH2: second threshold
V: voltage applied to ESC electrode

What is claimed is:

1. A plasma processing apparatus, comprising:

a chamber in which a plasma processing is performed;

a stage which is disposed in the chamber and on which a substrate held by a conveying carrier having an annular frame and a holding sheet is placed;

an electrostatic chuck system disposed inside the stage and having an electrostatic chuck electrode that, when applied with a voltage, chucks the substrate to the stage;

a plasma generation unit that, when applied with a high-frequency power, generates a first plasma and a second plasma in the chamber;

a control unit that controls the electrostatic chuck system and the plasma generation unit such that a processing with the first plasma and a processing with the second plasma are performed on the substrate while the substrate is chucked to the stage; and an abnormality detection unit that detects an abnormality, based on a plurality of parameters indicating an operating status of the electrostatic chuck system and the plasma generation unit, wherein the abnormality detection unit performs a first abnormality detection process during a first predetermined period immediately after switching between the processing with the first plasma and the processing with the second plasma, based on a first parameter that includes a monitoring information related to at least one of a voltage and a current applied to the electrostatic chuck electrode and does not include a monitoring information related to a pressure within the chamber, and performs a second abnormality detection process during a second predetermined period outside the first predetermined period, based on a second parameter that includes the monitoring information related to the pressure within the chamber.

2. The plasma processing apparatus according to claim 1, wherein the first parameter does not include a monitoring information related to a high-frequency power applied to the plasma generation unit.

3. The plasma processing apparatus according to claim 1, wherein the second parameter further includes the monitoring information related to at least one of the voltage and the current applied to the electrostatic chuck electrode.

4. The plasma processing apparatus according to claim 1, wherein the control unit is configured not to change a set value of the voltage applied to the electrostatic chuck electrode, when switching between the processing with the first plasma and the processing with the second plasma.

5. The plasma processing apparatus according to claim 1, wherein the first plasma deposits a protective film on a surface of the substrate, the second plasma etches the surface of the substrate, and the control unit controls the plasma generation unit so as to alternately perform the processing with the first plasma and the processing with the second plasma.

6. The A plasma processing method using a plasma processing apparatus including:

a chamber in which a plasma processing is performed, a stage which is disposed in the chamber and on which a substrate held by a conveying carrier having an annular frame and a holding sheet is placed, an electrostatic chuck system disposed inside the stage and having an electrostatic chuck electrode that, when applied with a voltage, chucks the substrate to the stage, and a plasma generation unit that, when applied with a high-frequency power, generates a first plasma and a second plasma in the chamber, the method comprising:

a control step of controlling the electrostatic chuck system and the plasma generation unit such that a processing with the first plasma and a processing with the second plasma are performed on the substrate while the substrate is chucked to the stage; and an abnormality detection step of detecting an abnormality, based on a plurality of parameters indicating an operating status of the electrostatic chuck system and the plasma generation unit, wherein in the abnormality detection step, a first abnormality detection process is performed during a first predetermined period immediately after switching between the processing with the first plasma and the processing with the second plasma, based on a first parameter that includes a monitoring information related to at least one of a voltage and a current applied to the electrostatic chuck electrode and does not include a monitoring information related to a pressure within the chamber, and a second abnormality detection process is performed during a second predetermined period outside the first predetermined period, based on a second parameter that includes the monitoring information related to the pressure within the chamber.

7. The plasma processing method according to claim 6, wherein the first parameter does not include a monitoring information related to a high-frequency power applied to the plasma generation unit.

8. The plasma processing method according to claim 6, wherein the second parameter further includes the monitoring information related to at least one of the voltage and the current applied to the electrostatic chuck electrode.

9. The plasma processing method according to claim 6, wherein in the control step, a set value of the voltage applied to the electrostatic chuck electrode is not changed, when switching between the processing with the first plasma and the processing with the second plasma.

10. The plasma processing method according to claim 6, wherein the first plasma deposits a protective film on a surface of the substrate, the second plasma etches the surface of the substrate, and in the control step, the plasma generation unit is controlled so as to alternately perform the processing with the first plasma and the processing with the second plasma.

* * * * *